(12) United States Patent
Dean

(10) Patent No.: US 7,466,561 B2
(45) Date of Patent: Dec. 16, 2008

(54) SYSTEM FOR INSERTION AND EXTRACTION OF AN ELECTRONIC MODULE

(75) Inventor: Steven J. Dean, Chippewa Falls, WI (US)

(73) Assignee: Silicon Graphics, Inc., Sunnyvale, CA (US)

( * ) Notice: Subject to any disclaimer, the term of this patent is extended or adjusted under 35 U.S.C. 154(b) by 490 days.

(21) Appl. No.: 11/261,045

(22) Filed: Oct. 28, 2005

(65) Prior Publication Data

US 2007/0097662 A1    May 3, 2007

(51) Int. Cl.
*H05K 7/14* (2006.01)
(52) U.S. Cl. .................. 361/798; 361/754; 361/801; 361/759
(58) Field of Classification Search ................. 361/747, 361/756, 759, 801, 741, 754, 798
See application file for complete search history.

(56) References Cited

U.S. PATENT DOCUMENTS

| | | | | |
|---|---|---|---|---|
| 4,914,550 A | * | 4/1990 | Filsinger et al. | 361/715 |
| 5,470,241 A | * | 11/1995 | Kaufman et al. | 439/159 |
| 6,171,120 B1 | * | 1/2001 | Bolich et al. | 439/157 |
| 6,252,514 B1 | * | 6/2001 | Nolan et al. | 340/686.4 |
| 6,406,312 B1 | * | 6/2002 | Heitkamp | 439/160 |
| 6,411,517 B1 | * | 6/2002 | Babin | 361/759 |
| 6,930,892 B2 | * | 8/2005 | Barringer et al. | 361/801 |
| 6,953,232 B2 | * | 10/2005 | Busby et al. | 312/332.1 |
| 6,975,519 B2 | * | 12/2005 | Siahpolo et al. | 361/798 |
| 7,210,712 B2 | * | 5/2007 | Artsiely | 292/97 |

* cited by examiner

*Primary Examiner*—Dean A. Reichard
*Assistant Examiner*—Dameon E Levi
(74) *Attorney, Agent, or Firm*—Schwegman, Lundberg & Woessner, P.A.

(57) ABSTRACT

The system includes a chassis and a printed circuit board (e.g., a motherboard) that is attached to the chassis. The system further includes an actuator that is slidably engaged with the chassis and a cam plate that is rotatably engaged with the chassis. The actuator engages the cam plate such that maneuvering the actuator rotates the cam plate. The system further includes a blade (e.g., an electronic module) which is slidably engaged with the chassis such that the blade slides in a first direction within the chassis as the blade is inserted into the chassis. The blade is inserted into the chassis until the blade engages the cam plate. The cam plate engages the blade such that rotation of the cam plate causes the blade to continue to move in the first direction and engage the printed circuit board.

20 Claims, 17 Drawing Sheets

SYSTEM FOR INSERTION AND EXTRACTION OF AN ELECTRONIC MODULE

FIELD OF THE INVENTION

The present invention relates to an electrical connector and more specifically to a system for insertion and extraction of an electronic module.

BACKGROUND OF THE INVENTION

High speed electronic digital computers often include numerous electrical connections between various printed circuit cards (i.e., boards) within a system. In some systems, a printed circuit board (e.g., motherboard) is provided with a plurality of connectors along one surface such that other printed circuit boards (i.e., blades) are attached to the connectors on the motherboard. The motherboard is typically in a fixed position when one or more blades are plugged into the connectors on the motherboard.

Connecting an additional motherboard to the blades can be difficult due to the misalignment of the opposing edges of the blades relative to the connectors on the second motherboard. Therefore, the blades are typically connected to only one motherboard.

The lack of flexibility in connecting a blade to a motherboard may cause design difficulties in some rack mounted computer systems. A typical rack mount system includes multiple blades (or modules) that form the computer system.

One of the issues with many rack mounted computer systems is that there is often a lack of accessibility to the blades once they are assembled onto a motherboard. In addition, a relatively large force is typically needed in order to insert a blade into a connector on a motherboard.

The individuals that service computers often times apply a potentially damaging force to a blade when the blade is not properly aligned relative to the connector on the motherboard. In addition, the force that is applied to the blade in order to insert the blade into a connector on the motherboard is sometimes applied to the blade at an inappropriate angle such that the force generates an unacceptable level of stress within the blade and the connector on the motherboard.

U.S. Pat. No. 6,411,517 discloses a system for removably connecting a circuit card to a connector of an electronic device. The system includes a support structure for loading the circuit card into the electronic device. The support structure is adapted to be slidably inserted along a first axis within the electronic device to a first position. An actuator is mounted to the support structure such that the actuator selectively displaces the circuit card relative to the support structure along a second axis. The circuit card is displaced from the first position to a connection position where the circuit card is operatively coupled to the connector of the electronic device. The support structure includes a sliding member and an intermediate member where the intermediate member is mounted between the sliding member and the circuit card. The circuit card is mounted to the intermediate member and the intermediate member is movable relative to the sliding member such that the intermediate member and the circuit card move together in response to activation of the actuator.

One of the drawbacks with the system disclosed in U.S. Pat. No. 6,411,517 is that it requires an additional support structure to be attached to the circuit card. The additional support structure takes up valuable space within the system and adds unwanted expense to the cost associated with fabricating the system.

Another drawback with the system disclosed in U.S. Pat. No. 6,411,517 is that the circuit card moves in two different directions as part of the circuit card insertion process. The movement of the circuit card in two directions during insertion causes the system to use extra space during operation.

SUMMARY OF THE INVENTION

The present invention relates to a system for removably connecting a blade (e.g., an electronic module) with an electronic device (e.g., a motherboard). The system includes an actuator that acts upon a cam plate in order to cause the cam plate to rotate. As the cam plate rotates, the cam plate maneuvers a projection (e.g., a roller) on the blade in order to mate (or unmate) the blade with a connector on the motherboard.

The blade is initially slid into a chassis that includes the motherboard in one direction. The blade is then mated into a connector on the motherboard by moving the blade in the same direction. Since the original sliding direction and the direction of blade insertion into the connector on the motherboard are the same, the system minimizes the space that is required to removably connect a blade with an electronic device.

The system may be used a part of a computer assembly. The system includes a chassis and a printed circuit board (e.g., a motherboard) that is attached to the chassis. The system further includes an actuator that is slidably engaged with the chassis and a cam plate that is rotatably engaged with the chassis. The actuator engages the cam plate such that maneuvering the actuator rotates the cam plate. The system further includes a blade (e.g., an electronic module) which is slidably engaged with the chassis such that the blade slides in a first direction within the chassis as the blade is inserted into the chassis. The blade is inserted into the chassis until the blade engages the cam plate. The cam plate engages the blade such that rotation of the cam plate causes the blade to continue to move in the first direction and engage the printed circuit board.

In some embodiments, the actuator is an elongated handle that includes a gripping end and an opposing end such that the opposing end of the handle engages the cam plate. The actuator may also include a pin that extends from the opposing end of the actuator on one side of the actuator. The pin may include a head that has a width which allows the head to be inserted through a slot in the cam plate, and a length which prevents the head from passing through the slot in the cam plate.

In some embodiments, the cam plate includes a projection that engages the blade such that the cam plate applies a force to the blade in substantially the first direction as the actuator rotates the cam plate. The projection on the cam plate may be a rib that projects from one side of the cam plate. In addition, the blade may include a substrate and an extension that projects from the substrate. The extension may include a head that is rotatably mounted on the extension such that the head rotatably engages the rib.

As an example, the extension may be a pin that is threaded into the substrate. The rib may be arranged on the cam plate such that the rib is able to maneuver the head on the extension back and forth in the first direction depending on which way the actuator is maneuvered.

The system may be incorporated into a rack mount computer system that includes a frame and a plurality of chassis mounted in the frame. The rack mount computer system further includes (i) a plurality of printed circuit boards such that each printed circuit board is attached to one of the chassis; (ii) a plurality of actuators such that each actuator is slidably engaged with one of the chassis; (iii) a plurality of cam plates such that each cam plate is rotatably engaged with the chassis; and (iv) a plurality of blades such that each blade is slidably engaged with the chassis where each blade slides in a first direction within the chassis as the blades are inserted into the chassis.

Each of the actuators in the rack mount computer system is engaged with one of the cam plates such that maneuvering one of the actuators rotates one of the cam plates. In addition, each of the blades is slidably inserted into the chassis until the blades engage one of the cam plates. The cam plates engage each of the blades such that rotation of one of the cam plates causes one of the respective blades to continue to move in the first direction and engage one of the printed circuit boards.

The system allows for maximum utilization of space within a computer assembly since the blades are originally slid into the chassis in the same direction as the blades are inserted into a connector on the motherboard. In addition, the system only requires minimal additional structures that engage the blade such that the expense which is associated with fabricating the system is reduced.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures.

The description set out herein illustrates the various embodiments of the invention and such description is not intended to be construed as limiting in any manner.

DESCRIPTION OF THE PREFERRED EMBODIMENT

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
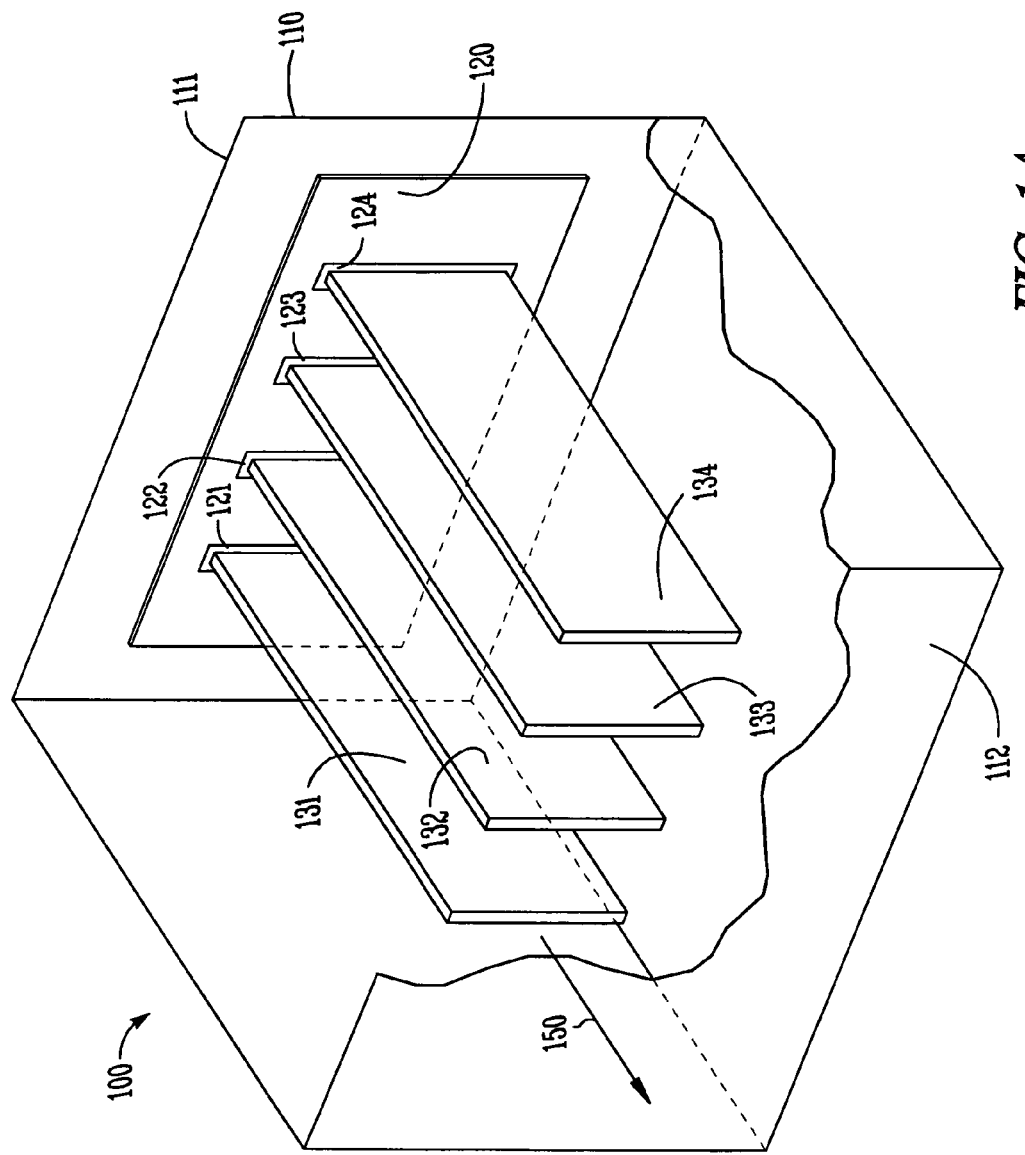
FIG. 1A illustrates a perspective view of a prior art computer assembly.

FIG. 1A illustrates a perspective view of a prior art computer assembly 100 that includes a rack 110. The computer assembly 100 includes a motherboard 120 having a plurality of connectors 121, 122, 123, 124. The system 100 also includes a plurality of daughterboards 131, 132, 133, 134 which plug into the slots associated with the connectors 121, 122, 123, 124.

In the example system 100, the motherboard 120 is referred to as a backplane. The connectors 121, 122, 123, 124 are edge connectors that grip the edge of the respective daughterboards 131, 132, 133, 134 after they are pressed or forced into the slot associated with the connectors 121, 122, 123, 124. The edge of each of the daughterboards 131, 132, 133, 134 is provided with electrical contacts which engage corresponding electrical contacts in the slots of the connectors 121, 122, 123, 124 on the motherboard 120. Arrow 150 shows the direction for extraction and addition of daughterboards 131, 132, 133, 134 with respect to the motherboard.

Figure 1B:
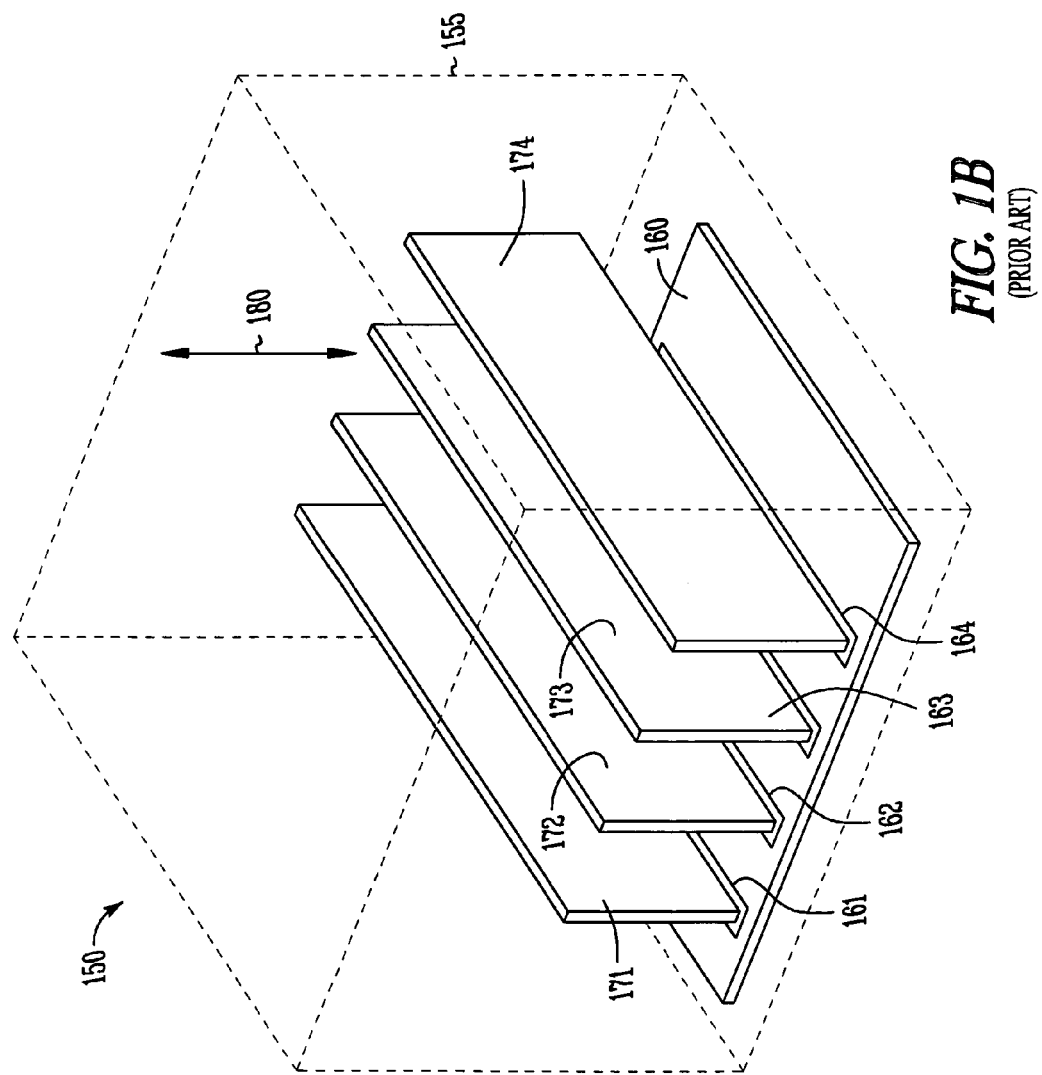
FIG. 1B illustrates a perspective view of another prior art computer assembly.

FIG. 1B shows another prior art computer assembly 150 that is often associated with a case 155 (e.g., a personal computer). The case 155 may be sized to accommodate different form factors of motherboards 160 which fit within the case. There are cases that are used for storing server type computers as well as home computers or workstations. The case 155 is depicted by the dotted box surrounding the motherboard 160 and a set of daughterboards 171, 172, 173, 174. The motherboard 160 includes a number of electrical contact slots 161, 162, 163, 164 that receive edge connectors on the daughterboards 171, 172, 173, 174. The connectors 161, 162, 163, 164 are edge connectors that grip the edge of the respective daughterboards 171, 172, 173, 174 after being pressed or forced into the slot associated with the connectors 161, 162, 163, 164.

One drawback with the system 150 shown in FIG. 1B is that the motherboard 160 may be prone to failed connections. In addition, the top of the case must be removed in order to extract or add daughterboards 171, 172, 173, 174 to the motherboard 120. Arrow 180 shows the direction in which the daughterboards 171, 172, 173, 174 must be moved in order to extract or add daughterboards 171, 172, 173, 174 to the motherboard 160.

FIG. 2-15 illustrate part (or all) of a system 200 for a computer assembly. The system 200 includes a chassis 201 and a printed circuit board 202 that is attached to the chassis. The system 200 further includes an actuator 203 that slidably engages the chassis 201 and a cam plate 204 that rotatably engages the chassis. The actuator 203 engages the cam plate 204 such that maneuvering the actuator 203 rotates the cam plate 204 (compare, e.g., FIGS. 8 and 9 and FIGS. 10 and 11).

The system 200 further includes a blade 205 (see FIGS. 12 and 13) that slidably engages the chassis 201 such that the blade 205 slides in a first direction (see arrow X) within the chassis as the blade 205 is inserted into the chassis 201. The blade 205 is inserted into the chassis 201 until the blade 205 engages the cam plate 204 (see FIG. 14). The cam plate 204 engages the blade 205 such that rotation of the cam plate 204 causes the blade 205 to continue to move in the first direction X and engage the printed circuit board 202 (see FIG. 15).

It should be noted that the printed circuit board 202 may be a motherboard, circuit card or any other type of electronic board. In addition, the system 200 may include a plurality of motherboards depending on the type of computer assembly where the system 200 is used. Although the printed circuit board 202 is shown in the FIGS. as being perpendicular to the blade 205, the printed circuit board may be oriented at any angle relative to the blade 205.

The blade 205 may be a daughterboard, circuit card or any other type of electronic module that is configured to be attached to an electronic board. Depending on the type of blade 205 that is used the system 200, the blade 205 may includes multiple cards, boards or modules. In addition, the blade 205 may include one or more hard disks, CD or DVD-ROM, PCI cards (among other items).

Figure 2:
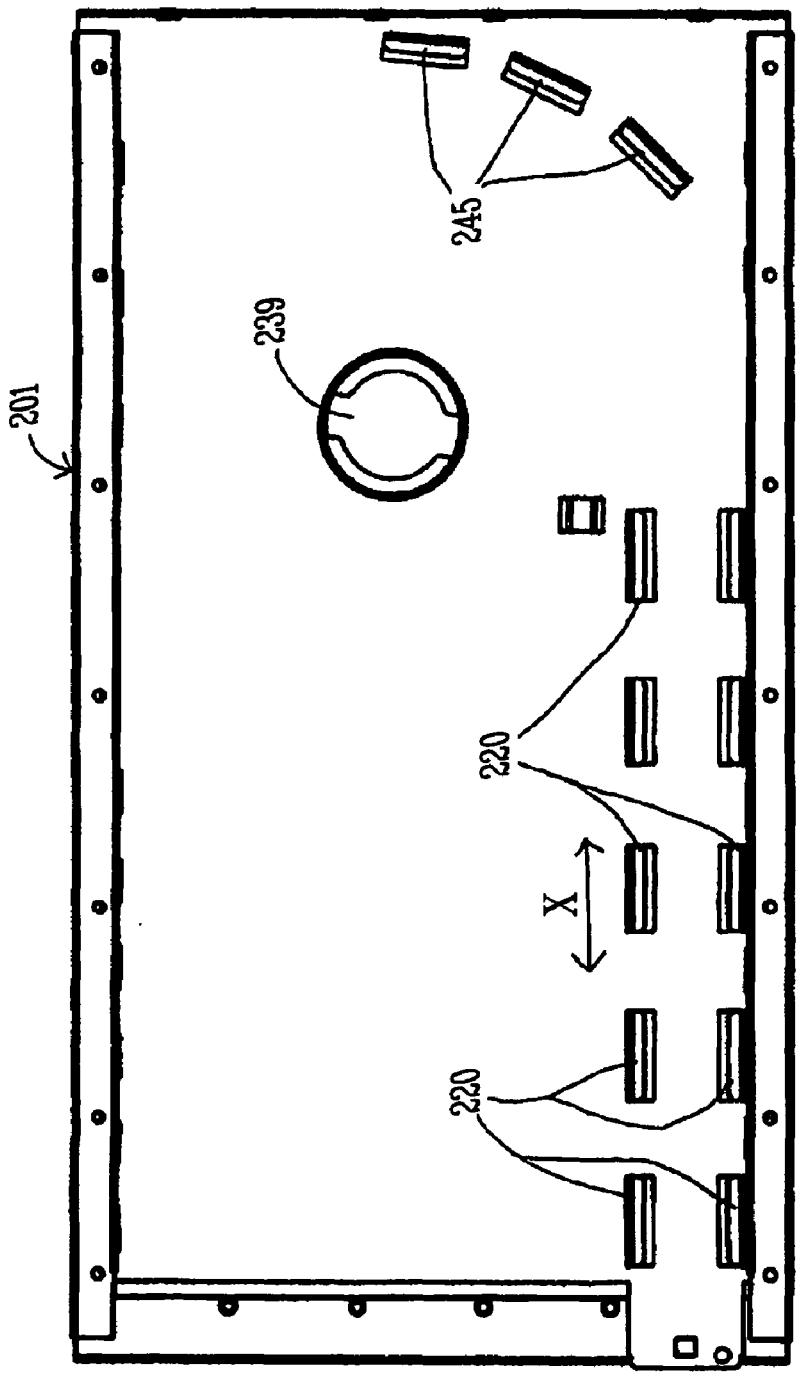
FIG. 2 is a side view of an example chassis that may be included in the system of the present invention.
Figure 3:
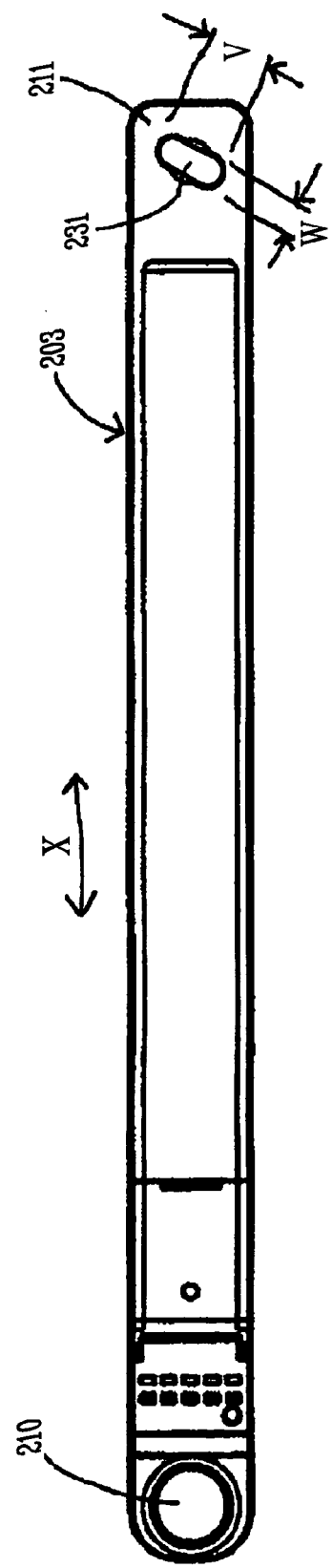
FIG. 3 is a side view of an example actuator that may be included in the system of the present invention.
Figure 4:
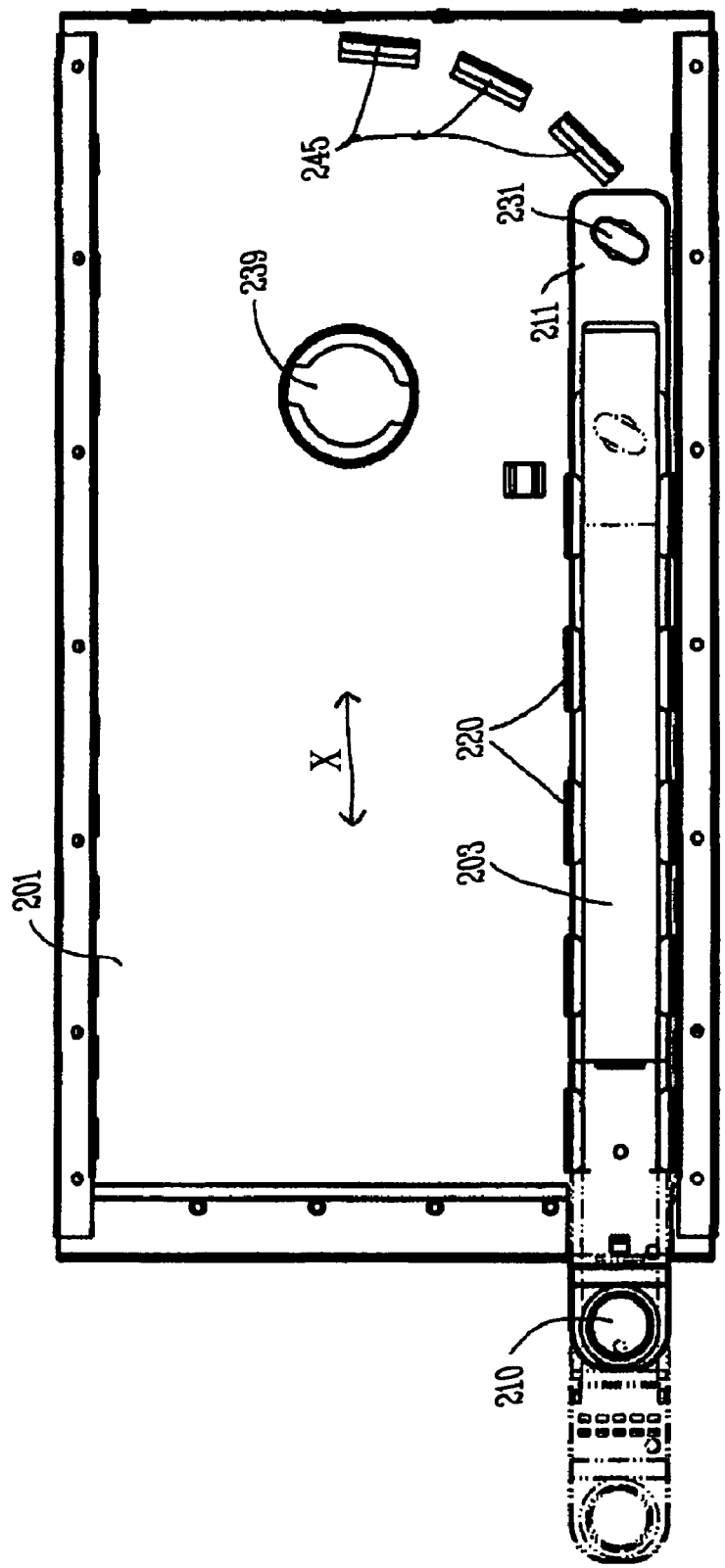
FIG. 4 is a side view of the example actuator shown in FIG. 3 attached to the example chassis shown in FIG. 2.

FIG. 2 is a side view of an example chassis 201 that may be included in the system 200 and FIG. 3 is a side view of the example actuator 203 that may be included in the system 200. The actuator 203 may be an elongated handle that includes a gripping end 210 and an opposing end 211 such that the opposing end 211 of the handle engages the cam plate 204 (see FIGS. 8-11).

In addition, the chassis 201 may include at least one projection 220 (several are shown in the FIGS.) that retains the actuator 203 while permitting the actuator 203 to move back and forth in the first direction X. It should be noted that the number, design, size and arrangement of the projections 220 on the chassis 201 may vary as long as the actuator 203 is able to adequately slide relative to the chassis 201 back and forth in the first direction X.

As shown in FIG. 3, the actuator 203 may include a pin (not directly visible in FIG. 3) that extends from the opposing end 211 of the actuator 203 on one side of the actuator 203. The pin includes a head 231 that has a width W (FIGS. 3 and 10) which allows the head 231 to be inserted through a slot 232 in the cam plate 204 and a length L (FIGS. 3 and 10) which prevents the head 231 from passing through the slot 232 in the cam plate 204.

Figure 10:
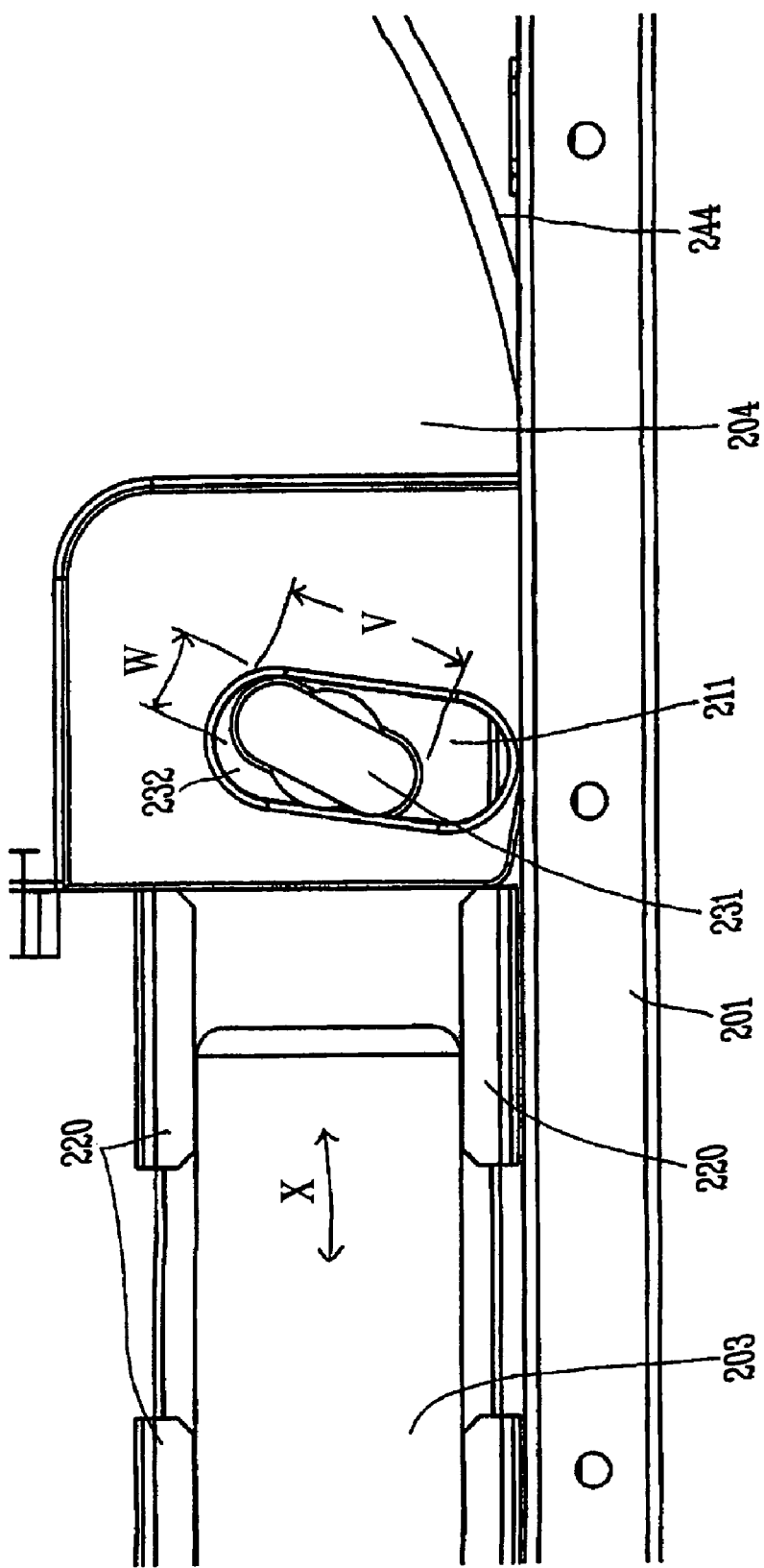
FIG. 10 is an enlarged side view of the actuator and the cam plate shown FIG. 8.
Figure 11:
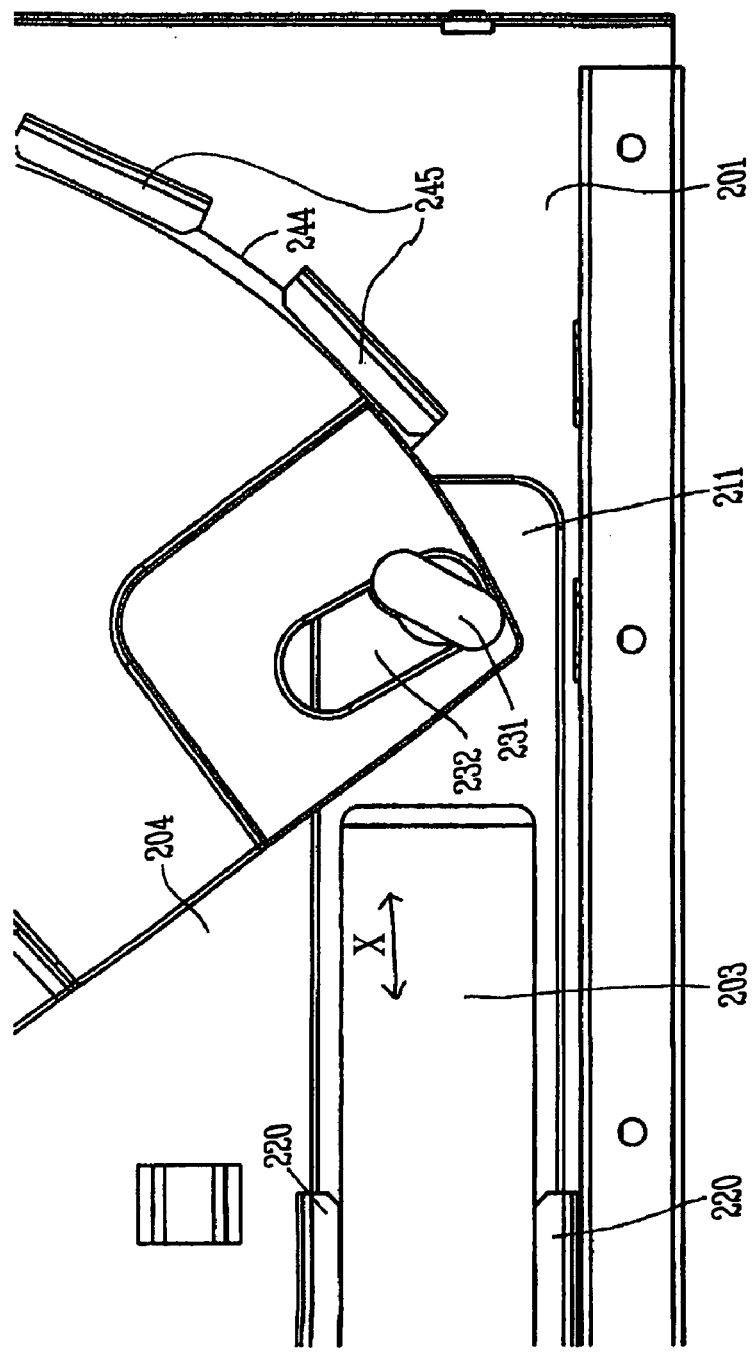
FIG. 11 is an enlarged side view of the actuator and the cam plate shown FIG. 9.

The ability of the head 231 to be inserted through the slot 232 depends on the relative position of the cam plate 204 and the actuator 203. FIG. 10 shows an example position where the head 231 may be passed through the slot 232 while FIG. 11 shows an example position where the length L of the head 231 prevents the head 231 from passing through the slot 232. It should be noted that the design, size and arrangement of the pin, head 231 and slot 232 may vary as long as (i) the pin 230 is able to adequately slide back and forth in the slot 232; and (ii) the head 231 can be inserted through the slot 232 in one position; and (iii) the head 231 can be prevented from passing through the slot 232 in another position.

Figure 5:
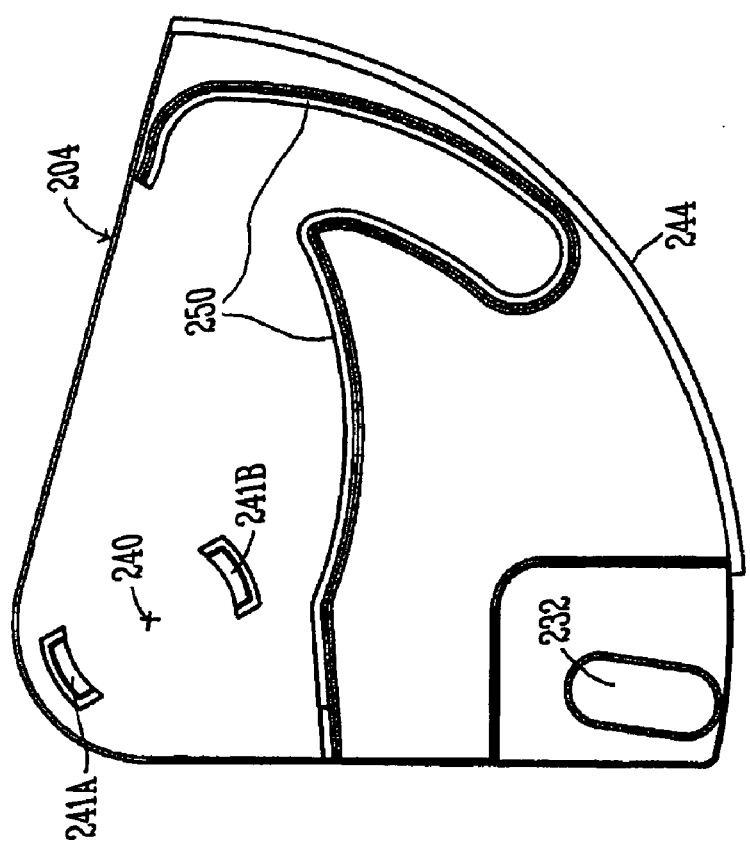
FIG. 5 is a side view of an example cam plate that may be included in the system of the present invention.
Figure 6:
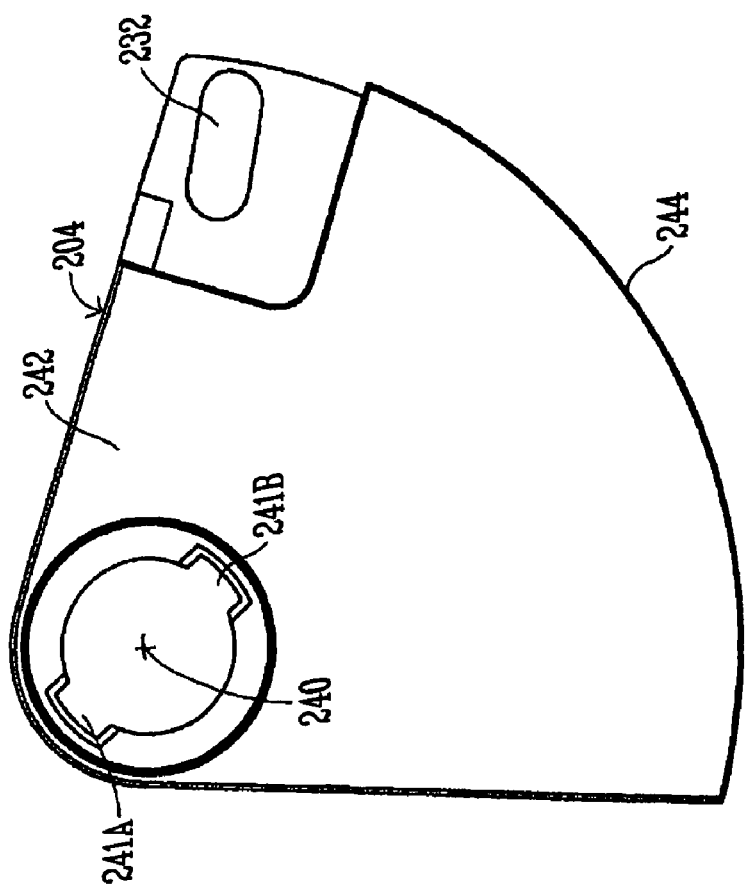
FIG. 6 is an opposing side view of the example cam plate shown in FIG. 5.

FIGS. 5 and 6 illustrate opposing side views of an example cam plate 204 that may be included in the system 200. The cam plate 204 includes a rotation axis 240 and a pair of arcuate projections 241A, 241B that extend from one side 242 of the cam plate 204. In the illustrated example cam plate 204, one arcuate projection 241A is positioned on one side of the rotation axis 240 and the other arcuate projection 241B is positioned on an opposing side of the rotation axis 240.

Figure 7:
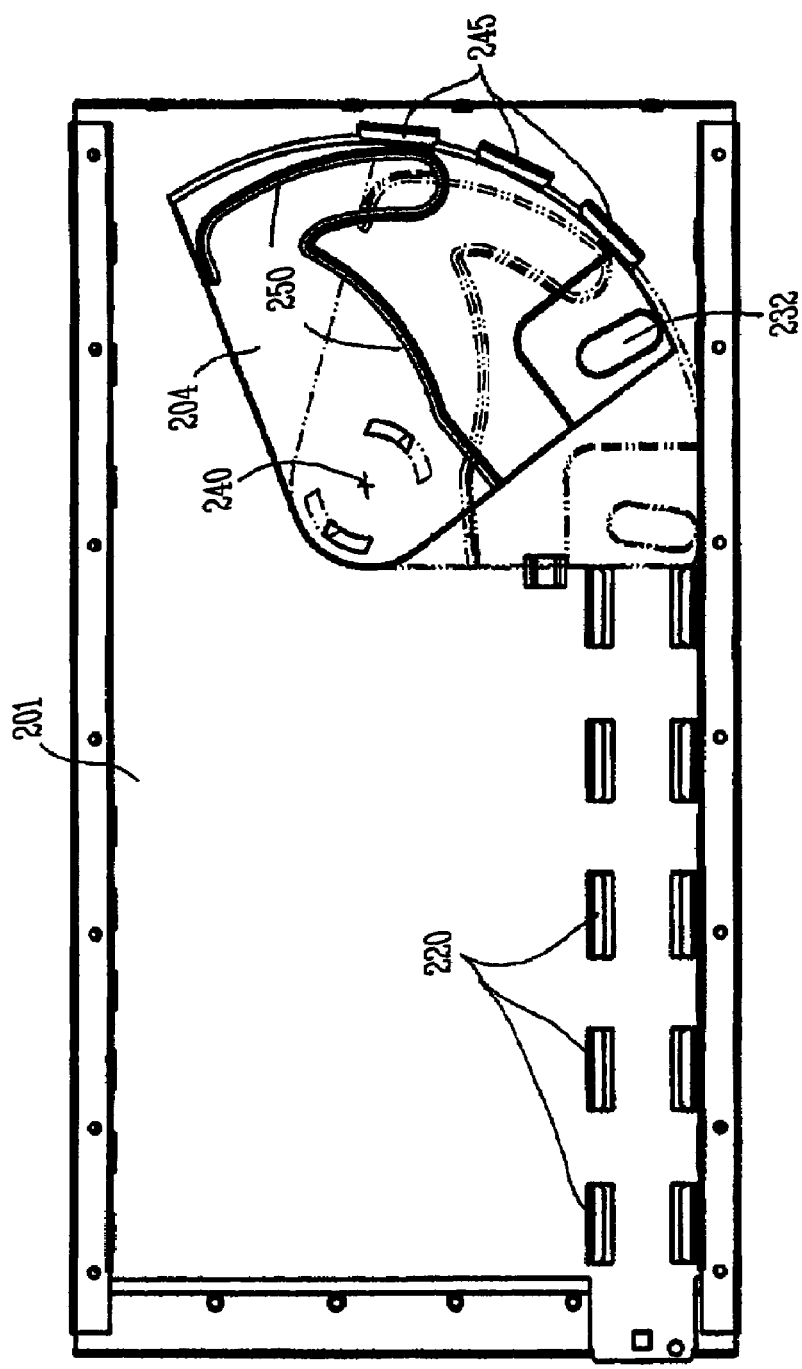
FIG. 7 is a side view of the example cam plate shown in FIG. 5 attached to the example chassis shown in FIG. 2.
Figure 8:
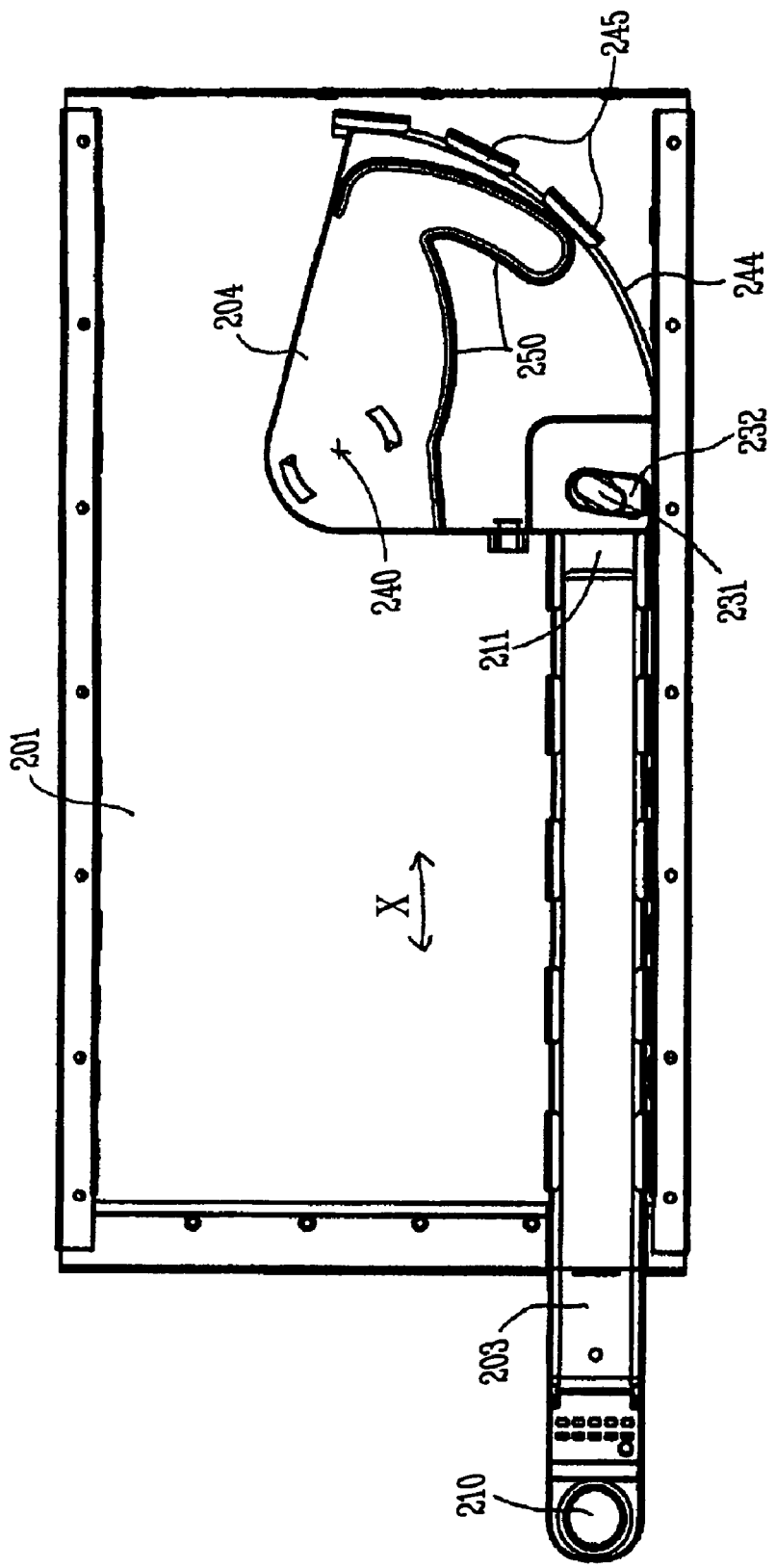
FIG. 8 is a side view of the example cam plate shown in FIG. 5 and the example actuator shown in FIG. 3 attached to the example chassis shown in FIG. 2 where the actuator is in an initial position.
Figure 9:
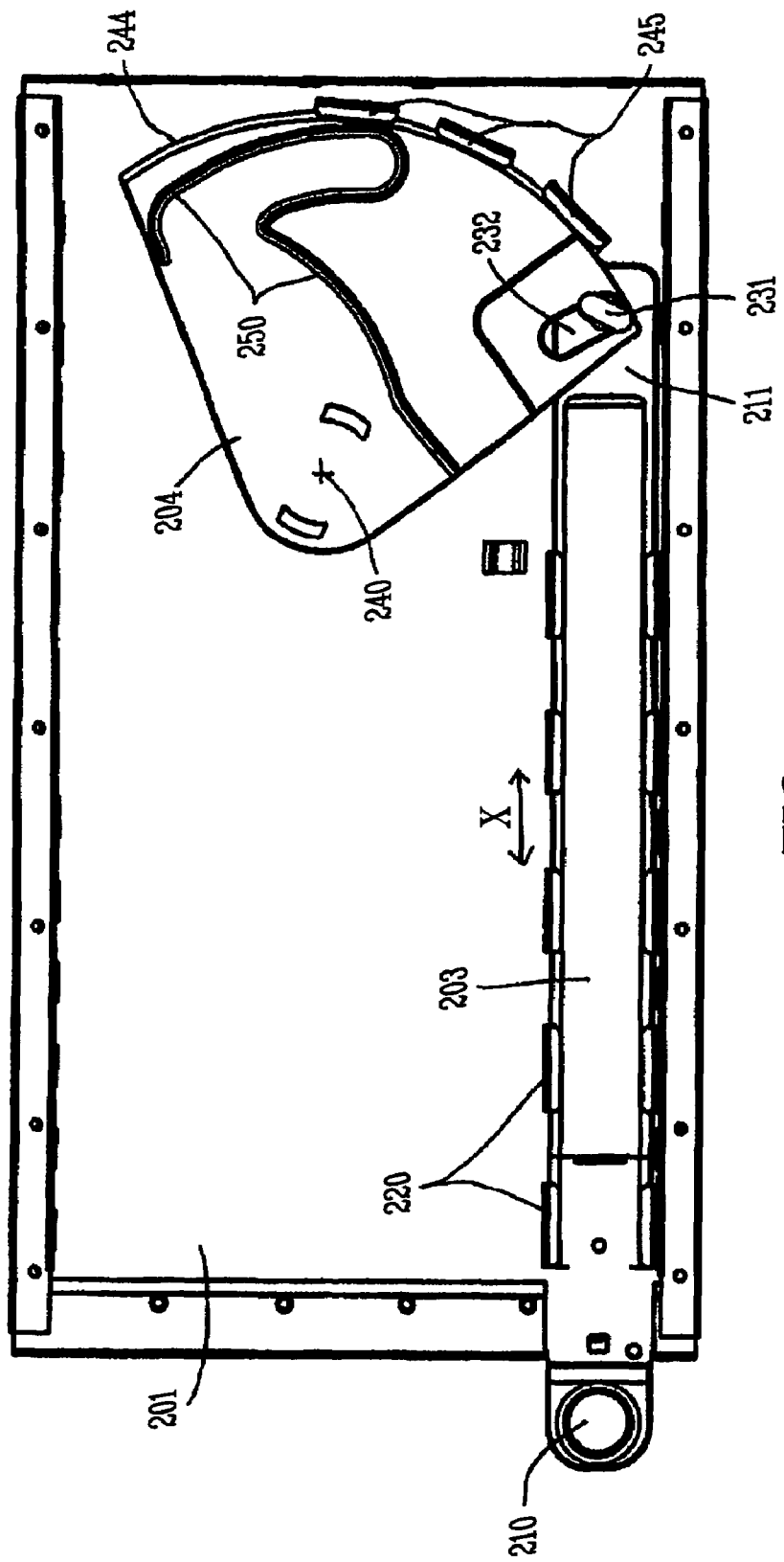
FIG. 9 is a side view similar to FIG. 8 where the actuator is in a connection position.

As shown in FIG. 7, the arcuate projections 241A, 241B extend through the chassis 201 such that the chassis 201 retains the cam plate 204 while permitting rotation of the cam plate 204 about the rotation axis 240. It should be noted that the number, design, size and arrangement of the projections 241A, 241B on the cam plate 204 and any openings 239 (see FIGS. 2 and 4) in the chassis 201 may vary as long as the cam plate 204 is able to adequately rotate relative to the chassis 201.

In some embodiments, the cam plate 204 may include an arcuate edge 244 that slidably engages one or more projections 245 which protrude from the chassis 201. As shown in FIGS. 2 and 7, the projections 245 may be arranged in an arcuate pattern on the chassis 201 such that the projections 245 provide support to the arcuate edge 244 of the cam plate 204 as the cam plate 204 rotates relative to the chassis 201.

Figure 14:
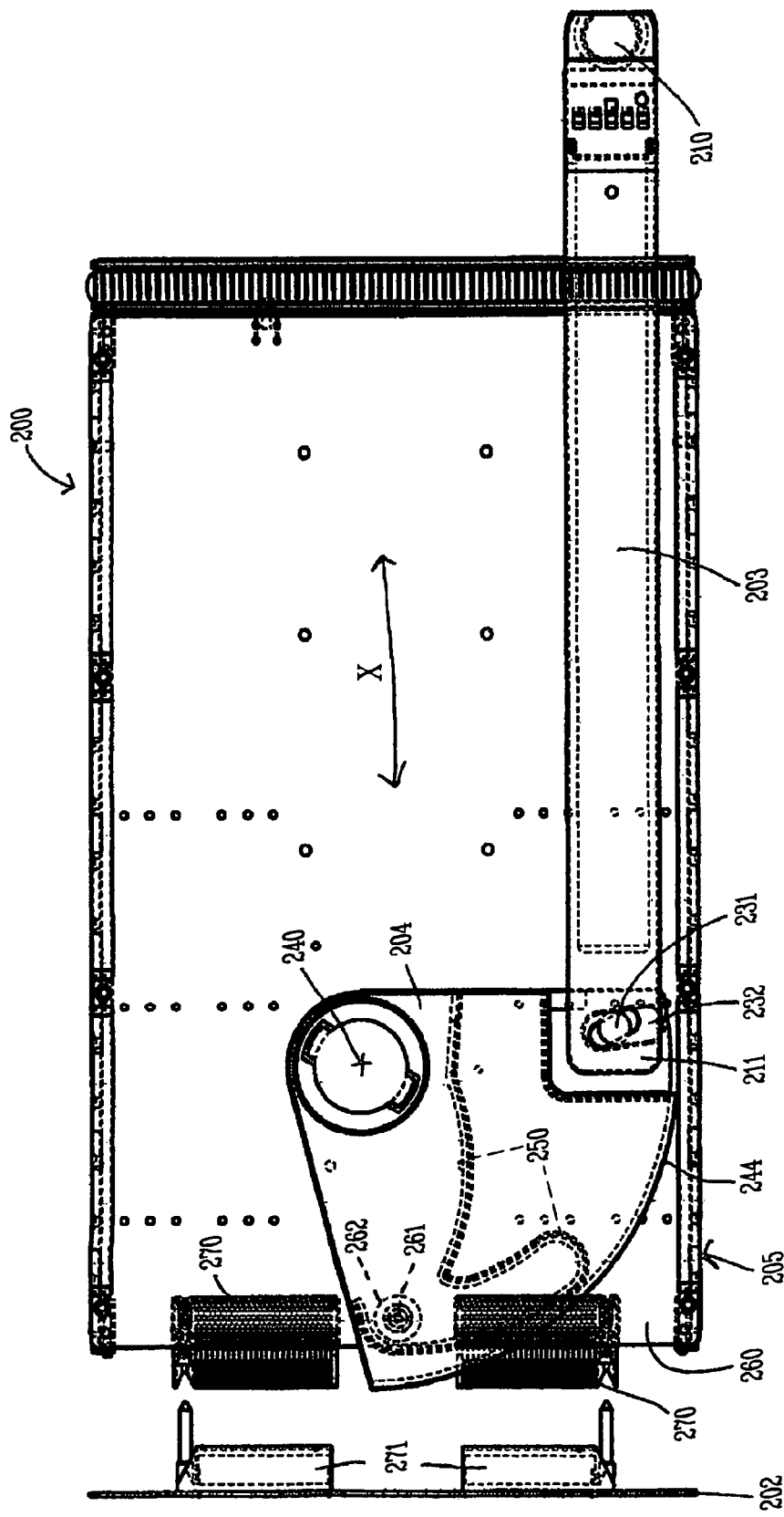
FIG. 14 is a side view of the blade shown in FIG. 13 engaged with the cam plate shown in FIGS. 5 and 6.
Figure 15:
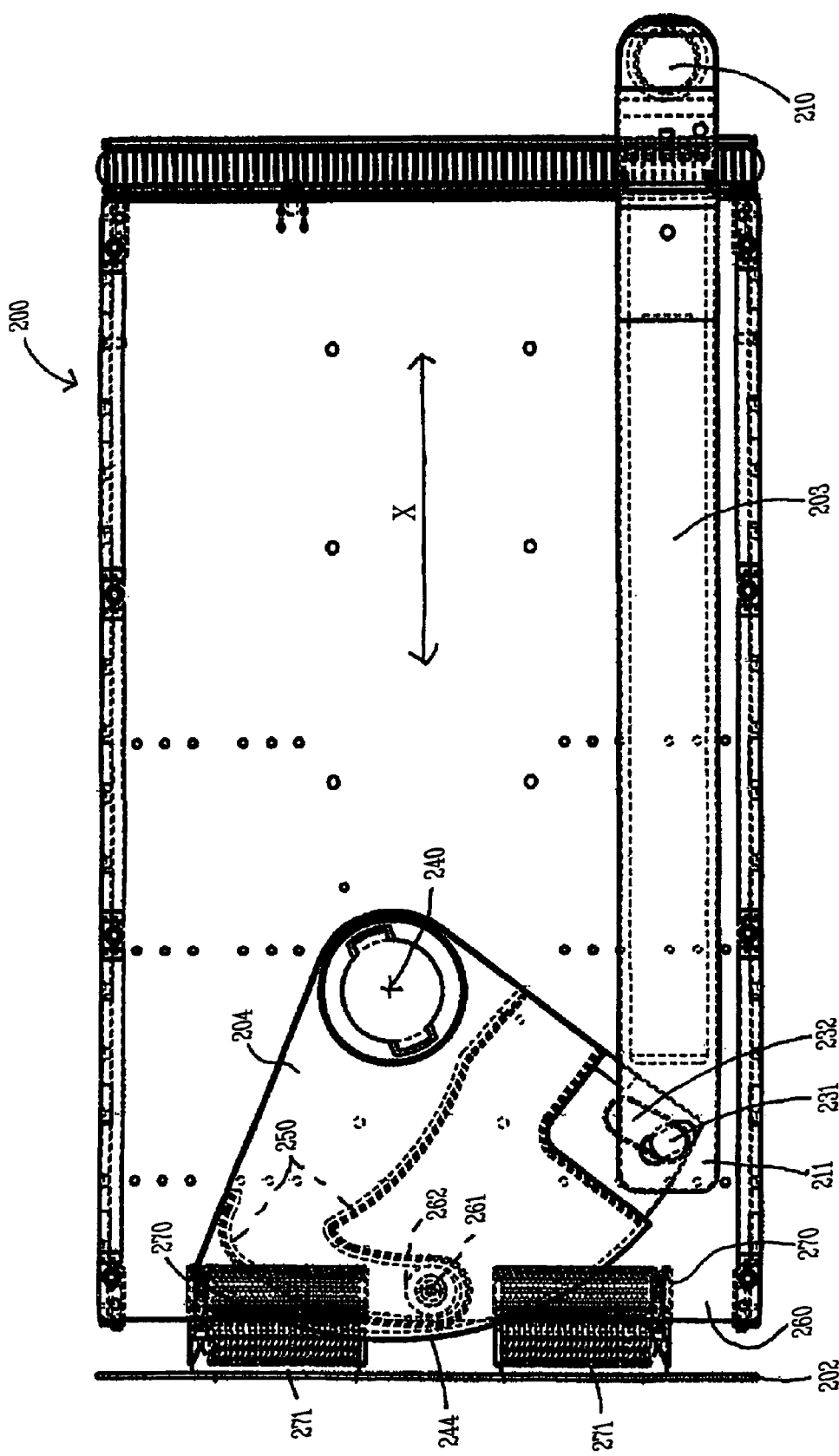
FIG. 15 is a side view similar to FIG. 14 where the cam plate has maneuvered the blade such that the blade is engaged with a motherboard.

As shown most clearly in FIGS. 5 and 7-9, the cam plate 204 includes a projection 250. FIGS. 14 and 15 show that the projection 250 engages that the blade 205 such that the cam plate 204 applies a force to the blade 205 in substantially the first direction X when the actuator 203 rotates the cam plate 204. In some embodiments, the projection 250 on the cam plate 204 is a rib 250 that projects from one side of cam plate 204.

Figure 12:
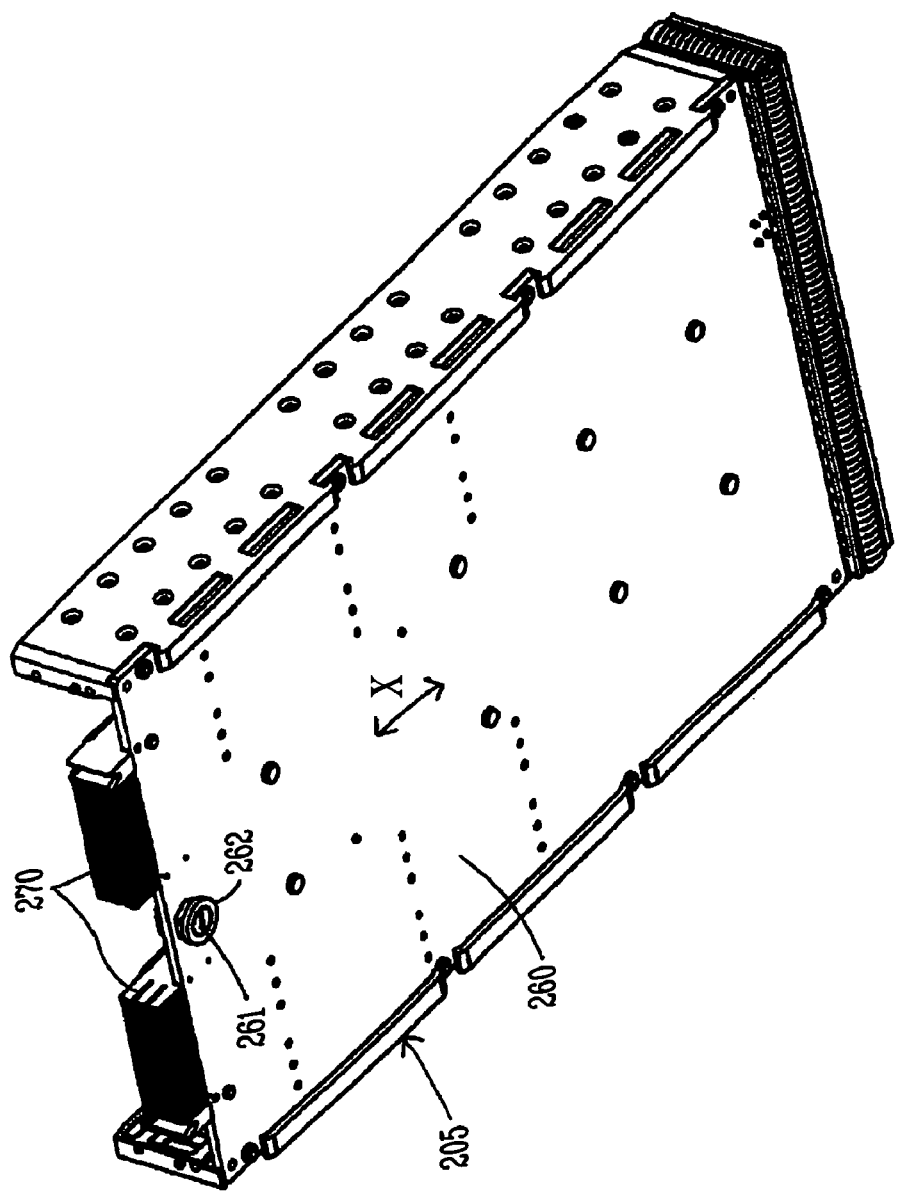
FIG. 12 is a side view of an example blade that may be included in the system of the present invention.
Figure 13:
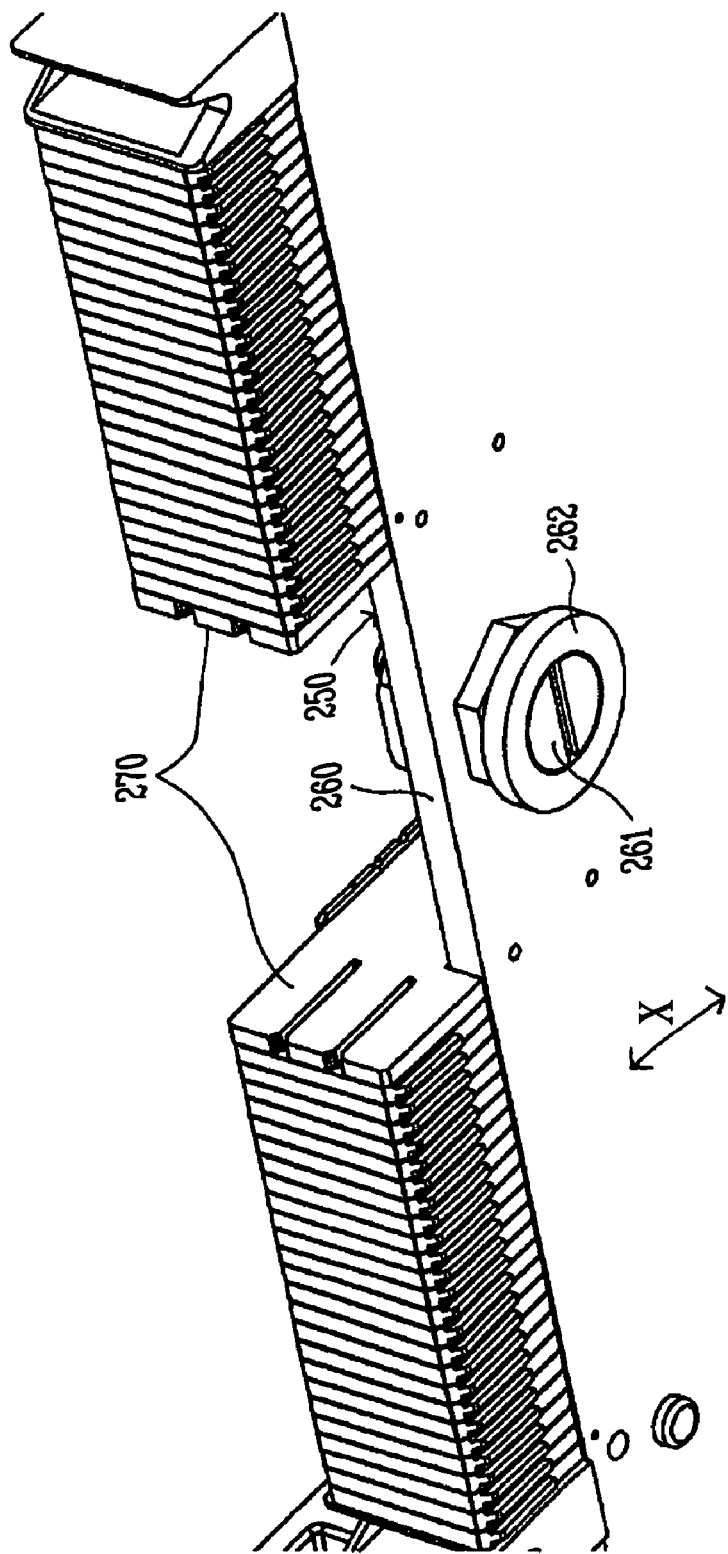
FIG. 13 is an enlarged side view of the example blade shown in FIG. 12.

FIGS. 12 and 13 show that the blade 205 may include a substrate 260 and an extension 261 that projects from the substrate 260. It should be noted that the substrate 260 may be a printed circuit board or some other type of relatively flat structure. In some embodiments, the extension 261 may include a head 262 that is rotatably mounted on the extension 261 such that the head 262 rotatably engages the rib 250.

As shown in FIGS. 2 and 7, the rib 250 may be arranged on the cam plate 204 such that the rib 250 is able to maneuver the head 262 on the blade 205 back and forth in the first direction X depending on which way the actuator 203 is maneuvered. In the illustrated example embodiment, the extension 261 is a pin that is threaded into the substrate 260. It should be noted that the design, size and arrangement of the rib 250, extension 261 and head 262 may vary as long as the rib 250 is able to force the substrate 260 back and forth in the first direction X.

In the example system 200 that is illustrated in FIGS. 14 and 15, the blade 205 includes a plurality of first connectors 270 and the motherboard includes a plurality of second connectors 271. Each of the first connectors 270 is adapted to mate with one of the second connectors 271 when the cam plate 204 applies a force to the blade in the first direction X.

It should be noted that the number, design, size and arrangement of the first connectors 270 on the blade 205 and the second connectors 271 on the printed circuit board 202 may vary as long as the blade 205 is appropriately electrically connected to the printed circuit board 202. In some embodiments, the printed circuit board 202 may be formed of multiple circuit boards such that each of the multiple circuit boards includes a second connector 271 that engages one of the first connectors 270 on the blade 205. In addition, one or more of the multiple circuit boards may be offset or at a different angle relative to the other circuit boards.

In still other embodiments, the blade 205 may be formed of multiple circuit boards such that each of the multiple circuit boards includes a first connector 270 that engages one of the second connectors 271 on the printed circuit board 202. In addition, one or more of the multiple circuit boards on the blade 205 may be offset or at a different angle relative to the other circuit boards.

The operation of the example system 200 will now be described with reference to FIGS. 14 and 15. The blade 205 is inserted into the chassis 201 (not shown in FIGS. 14 and 15 for purposes of clarity) in the first direction X until the head 262 of the extension 261 on the substrate 260 engages the rib 250 on the cam plate 204. Next, an individual maneuvers the actuator 203 in the first direction X so that the actuator 203 causes the cam plate 204 to rotate about rotation axis 240. As the cam plate 204 rotates, the rib 250 on the cam plate 204 applies a force to the head 262 on the blade 205 so that cam plate 204 maneuvers the blade 205 in the first direction X. The blade 205 moves in the first direction X until the first connectors 270 on the blade 205 engage the second connectors 271 on the printed circuit board 202.

The blade 205 is disengaged from the printed circuit board 202 by maneuvering the actuator 203 in an opposite direction so that the actuator 203 causes the cam plate 204 to rotate in an opposite direction. As the cam plate 204 rotates in the opposite direction, the rib 250 on the cam plate 204 applies a force to the head 262 so that cam plate 204 maneuvers the blade 205 in the opposite direction.

The example systems 200 described herein allow for a more efficient utilization of space since the blade 105 is inserted into the chassis 201 in the same direction that the blade 205 is engaged with a connector 271 on the motherboard 202. The system 200 may also reduce the stress that is associated with connecting a blade 205 to a printed circuit board 202.

Figure 16:
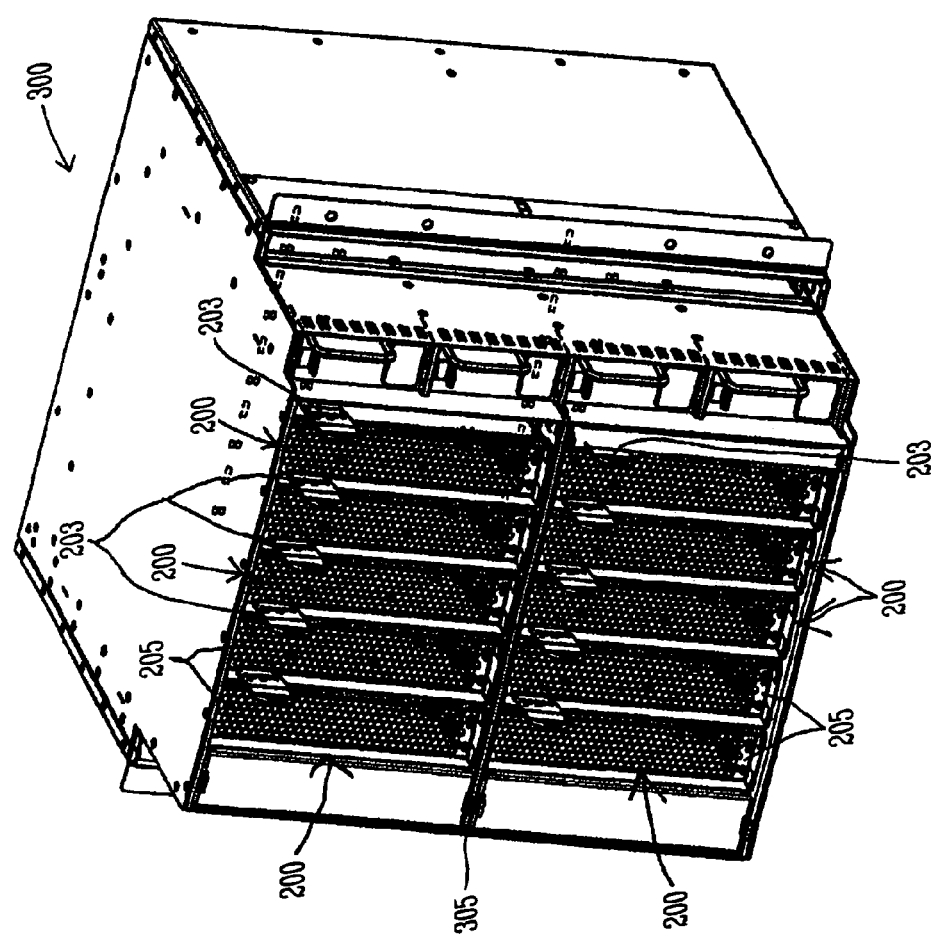
FIG. 16 is a side view of an example rack mounted computer assembly that includes a plurality of the systems shown in FIGS. 14 and 15.

As shown in FIG. 16, one or more systems 200 may be incorporated into a rack mount computer system 300 that includes a frame 305. It should be noted that the chassis in each system 200 may be mounted anywhere in the frame 305. In addition, the blades 205 in each system may be removably mounted in any chassis within the frame 305.

The blades 205 may be substantially parallel to one another within the frame 305. In addition, at least one of printed circuit boards in one of the systems 200 may be attached to a system bus (not shown) that electrically connects the printed circuit boards to other electrical components.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A system for a computer assembly, the system comprising:
   a chassis;
   a printed circuit board attached to the chassis;
   an actuator slidably engaged with the chassis;
   a cam plate rotatably engaged with the chassis, the actuator engaging the cam plate such that maneuvering the actuator rotates the cam plate; and
   a blade slidably engaged with the chassis such that the blade slides in a first direction within the chassis as the blade is inserted into the chassis until the blade engages the cam plate, the cam plate engaging the blade such that rotation of the cam plate causes the blade to continue to move in the first direction and engage the printed circuit board.

2. The system of claim 1 wherein the printed circuit board is a motherboard.

3. The system of claim 1 wherein the blade is a daughterboard.

4. The system of claim 1 wherein the actuator is an elongated handle that includes a gripping end and an opposing end such that the opposing end of the handle engages the cam plate.

5. The system of claim 4 wherein the actuator includes a pin that extends from the opposing end of the actuator on one side of the actuator, the pin including a head having a width that allows the head to be inserted through a slot in the cam plate and a length that prevents the head from passing through the slot in the cam plate.

6. The system of claim 1 wherein the cam plate includes a rotation axis and a pair of arcuate projections that extend from one side of the cam plate, one of the arcuate projection being positioned on one side of the rotation axis and the other arcuate projection being positioned on an opposing side of the rotation axis, the arcuate projections extending through the chassis such that the chassis retains the cam plate while permitting rotation of the cam plate about the rotation axis.

7. The system of claim 1 wherein the cam plate includes an arcuate edge that slidably engages one or more projections that protrude from the chassis, the projections being arranged in an arcuate pattern on the chassis.

8. The system of claim 1 wherein the chassis includes at least one projection that retains the actuator while permitting the actuator to move back and forth in the first direction.

9. The system of claim 1 wherein the cam plate includes a projection that engages the blade such that the cam plate applies a force to the blade in substantially the first direction as the actuator rotates the cam plate.

10. The system of claim 9 wherein the projection on the cam plate is a rib that projects from one side of the cam plate.

11. The system of claim 10 wherein the blade includes a substrate and an extension that projects from the substrate, the extension including a head that is rotatably mounted on the extension such that the head rotatably engages the rib.

12. The system of claim 11 wherein the rib is arranged on the cam plate such that the rib is able to maneuver the head on the blade back and forth in the first direction depending on which way the actuator is maneuvered.

13. The system of claim 1 wherein the blade includes a substrate and an extension that projects from the substrate, the extension including a head that is rotatably mounted on the extension such that the head rotatably engages the cam plate.

14. The system of claim 13 wherein the extension is a pin that is threaded into the substrate.

15. The system of claim 1 wherein the blade includes a first connector and the motherboard includes a second connector, the first connector being adapted to mate with the second connector when the cam plate moves the blade in the first direction toward the motherboard.

16. The system of claim 15 wherein the blade includes a plurality of first connectors and the motherboard includes a plurality of second connectors, each of the first connectors being adapted to mate with one of the second connectors when the cam plate moves the blade in the first direction toward the motherboard.

17. A rack mount computer system comprising:
   a frame;
   a plurality of chassis mounted in the frame;
   a plurality of printed circuit boards, each of the printed circuit board being attached to one of the chassis;
   a plurality of actuators, each of the actuators being slidably engaged with one of the chassis;
   a plurality of cam plates, each of the cam plates being rotatably engaged with the chassis, each of the actuators being engaged with one of the cam plates such that maneuvering one of the actuators rotates one of the cam plates; and
   a plurality of blades, each of the blades being slidably engaged with the chassis such that the blades slide in a first direction within the chassis as the blades are inserted into the chassis until the blades engage one of the cam plates, each cam plates engaging one of the blades such that rotation of one of the cam plates causes one of the blades to continue to move in the first direction and engage one of the printed circuit boards.

18. The system of claim 17 wherein the printed circuit board is a motherboard and the blade is a daughterboard.

19. The system of claim 17 wherein the actuator is an elongated handle that includes a gripping end and an opposing end such that the opposing end of the handle engages the cam plate, the actuator including a pin that extends from the opposing end of the actuator on one side of the actuator, the pin including a head having a width that allows the head to be inserted through a slot in the cam plate and a length that prevents the head from passing through the slot in the cam plate.

20. The system of claim 11 wherein the blade includes a substrate and an extension that projects from the substrate, the extension including a head that is rotatably mounted on the extension such that the head rotatably engages the cam plate, the extension being a pin that is threaded into the substrate.

* * * * *